(12) United States Patent
Nishide et al.

(10) Patent No.: US 6,452,264 B2
(45) Date of Patent: Sep. 17, 2002

(54) INSULATING THICK FILM COMPOSITION, CERAMIC ELECTRONIC DEVICE USING THE SAME, AND ELECTRONIC APPARATUS

(75) Inventors: Mitsuyoshi Nishide, Shiga-ken; Jun Urakawa; Yukinobu Sato, both of Omihachiman, all of (JP)

(73) Assignee: Murata Manufacturing Co. Ltd (JP)

( * ) Notice: Subject to any disclaimer, the term of this patent is extended or adjusted under 35 U.S.C. 154(b) by 0 days.

(21) Appl. No.: 09/798,758

(22) Filed: Mar. 2, 2001

(30) Foreign Application Priority Data

Mar. 2, 2000 (JP) ........................................ 2000-057474
Nov. 21, 2000 (JP) ........................................ 2000-354131

(51) Int. Cl.⁷ ............................................. H01L 23/10
(52) U.S. Cl. ..................... 257/703; 257/700; 438/125
(58) Field of Search ................................. 257/701, 703, 257/333, 352, 395, 324, 325, 671; 438/270, 271, 225, 439, 452, 125, 123, 216, 261, 591, 593

(56) References Cited

U.S. PATENT DOCUMENTS 5,616,956 A * 4/1997 Horiguchi et al. .......... 257/703
6,159,322 A * 12/2000 Ogata et al. ................. 156/230

FOREIGN PATENT DOCUMENTS

| JP | 10242623 | 9/1998 |
| JP | 11-251723 | 9/1999 |
| JP | 2000165020 | 6/2000 |

* cited by examiner

*Primary Examiner*—David Nelms
*Assistant Examiner*—Long K. Tran
(74) *Attorney, Agent, or Firm*—Dickstein, Shapiro, Morin & Oshinsky, LLP.

(57) ABSTRACT

An insulating thick film composition for forming a solder resist layer having a high degree of positional accuracy is provided, which can suppress warping and undulation of a multilayer ceramic substrate and can maintain the superior electrical characteristics thereof. The insulating thick film composition is primarily composed of a powdered ceramic having the same composition system as that of a powdered ceramic contained in a green ceramic sheet, and the mean particle diameter of the powdered ceramic of the insulating thick film composition is smaller than that of the powdered ceramic contained in the green ceramic body.

28 Claims, 1 Drawing Sheet

INSULATING THICK FILM COMPOSITION, CERAMIC ELECTRONIC DEVICE USING THE SAME, AND ELECTRONIC APPARATUS

BACKGROUND OF THE INVENTION

1. Field of the Invention

The present invention relates to insulating thick film compositions used for solder resists, materials for reinforcing strength, materials for adjusting density, materials for reducing irregularities, and the like, to ceramic electronic devices using the insulating thick film compositions, and to electronic apparatuses provided with the ceramic electronic devices.

2. Description of the Related Art

In recent years, the trends toward miniaturization and higher performance of electronic apparatuses, such as mobile communication apparatuses, are realized primarily by higher performances of semiconductor devices, such as LSIs, and by three-dimensional wiring and by wiring of higher densities on substrates mounting the semiconductor devices thereon. Ceramic substrates mounting various semiconductor devices are specifically required to be capable of connecting multi-terminals with narrower pitches, to have higher wiring density and to perform signal processing at higher frequencies. In particular, in response to the trend toward multi-terminals with narrower pitches, ceramic substrates are provided with a number of fine solder lands on major surfaces thereof.

However, when ceramic capacitors, semiconductor devices and the like are mounted by soldering on substrates, the locations at which soldering is performed are likely to deviate from the finer corresponding solder lands. In addition, when the solder is melted, it extends to undesirable areas at which soldering is not required due to wet spreading of the solder, and soldering defects and variation in characteristics may occur in some cases.

In order to prevent the wet spreading of solder, a method is known in which a solder resist layer is formed by a step of coating a resist resin which has poor wettability to solder on areas at which soldering is not required, and a step of curing the coated resin.

However, a ceramic substrate (in particular, a multilayer ceramic substrate) formed by baking a conductive pattern together with a laminate composed of green ceramic sheets tends to be warped and distorted due to the shrinkage during baking. Accordingly, locations of the conductive pattern may be varied, and thereby locations at which solder resists are coated may deviate from the designed points in some cases. This phenomenon is frequently observed in a high density mounting substrate having a number of fine solder lands thereon.

In order to solve the problem described above, for example, as disclosed in Japanese Unexamined Patent Application Publication No. 11-251723, when a ceramic substrate is formed by a step of coating an insulating paste composed of a powdered ceramic mixed with a glass component, as an overcoat layer on a green ceramic body having a surface conductive pattern, and a step of baking the insulating paste together with the ceramic substrate, relative positional accuracy between the surface conductive pattern and the overcoat layer can be improved.

However, since the insulating paste described above is composed of the glass component as an auxiliary agent for sintering and the powdered ceramic, the glass component diffuses to the ceramic substrate in baking and may adversely influence the sintering characteristics of the ceramic substrate in some cases. For example, since an area at which the overcoat is formed has the glass component at a concentration higher than that of an area at which the overcoat is not formed, the sintering behavior of the ceramic substrate may partly change. As a result, the generation of warping and undulation of the ceramic substrate may occur, and in addition, due to a reaction between the substrate and the glass, degradation in electrical characteristics may partly occur, and pores may be formed in some cases. Furthermore, the glass component in the overcoat layer may localize on the surface of the conductive pattern, and hence, the soldering characteristics and the plating characteristics may be degraded in some cases.

SUMMARY OF THE INVENTION

In consideration of the problems described above, the present invention was made. Accordingly, it is an object of the present invention to provide an insulating thick film composition baked together with a green ceramic body which can suppress the generation of warping and undulation of the green ceramic body caused by baking and which can better ensure the superior electrical characteristics. Another object of the present invention is to provide a ceramic electronic device formed by using an insulating thick film composition. In addition, a still another object of the present invention is to provide an electronic apparatus formed by using such ceramic electronic device.

The present invention relates to an insulating thick film composition which is baked together with a green ceramic body and comprises a powdered ceramic having the same composition system as that of a powdered ceramic contained in the green ceramic body, wherein the mean particle diameter of the powdered ceramic in the insulating thick film composition is smaller than that of the powdered ceramic contained in the green ceramic body.

In addition, the present invention relates to a ceramic electronic device formed by steps of forming a layer composed of an insulating thick film composition on a green ceramic body having a predetermined conductive pattern and baking the layer together with the green ceramic body, wherein the insulating thick film composition is an insulating thick film composition according to the present invention described above.

Since the insulating thick film composition of the present invention comprises a powdered ceramic having the same composition system as that of the powdered ceramic contained in the green ceramic body and since the mean particle diameter of the powdered ceramic in the insulating thick film composition is smaller than that of the powdered ceramic contained in the green ceramic body, superior electrical characteristics and dimensional stability of the green ceramic body can be satisfactory ensured.

In the present invention, "the same composition system" means that the powdered ceramic in the insulating thick film composition comprises at least one constituent component of the powdered ceramic contained in the green ceramic body. For example, when the powdered ceramic contained in the green ceramic body is a $BaO$—$Al_2O_3$—$SiO_2$-based ceramic, the powdered ceramic in the insulating thick film composition may contain at least one of $BaO$, $Al_2O_3$, and $SiO_2$.

In addition, since the ceramic electronic device of the present invention is a ceramic electronic device formed by the steps of coating the insulating thick film composition of the present invention on the green ceramic body having a predetermined conductive pattern and baking the coated insulating thick film composition together with the green ceramic body, a compact electronic device can be produced having superior electrical characteristics, dimensional stability and high performances. That is, a compact and highly reliable electronic apparatus having higher performances can be produced by using the electronic device of the present invention.

DESCRIPTION OF THE PREFERRED EMBODIMENTS

Figure 1:
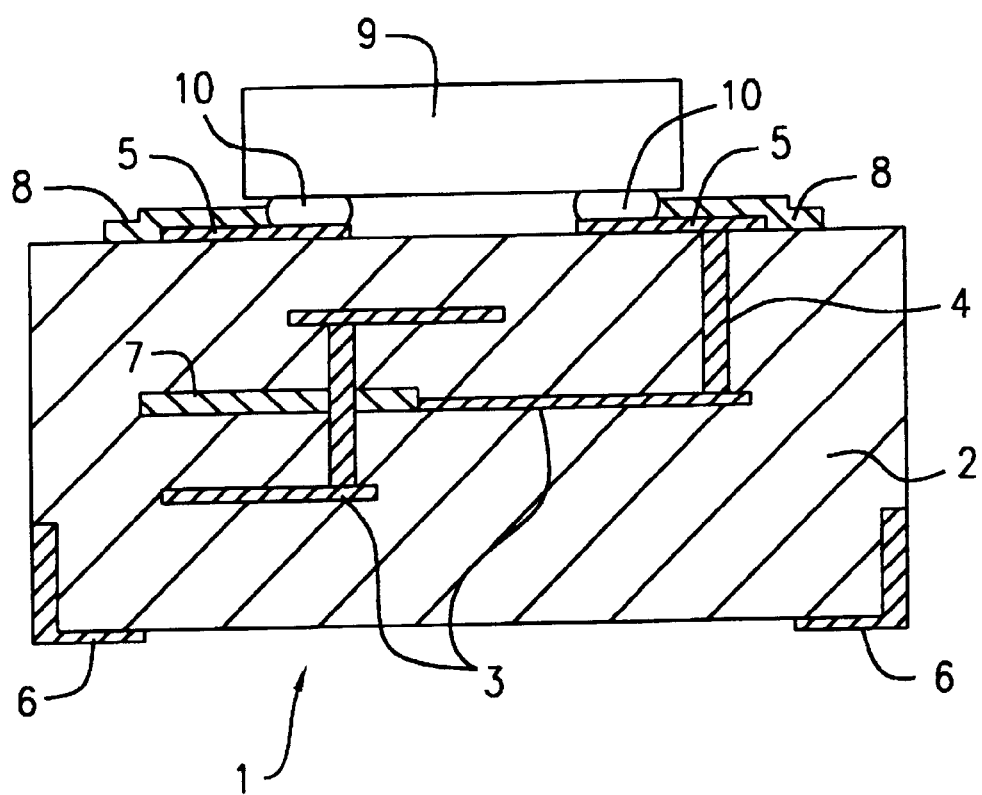
FIG. 1 is a schematic cross-sectional view of a ceramic electronic device of the present invention.

In the present invention, the mean particle diameter of a powdered ceramic in an insulating thick film composition is preferably smaller by about 10% or more than that of a powdered ceramic contained in a green ceramic body. When the mean particle diameter of the powdered ceramic in the insulating thick film composition is in the range mentioned above, without adding a glass component and the like to the composition, the insulating thick film composition can be sufficiently dense under the conditions for baking the green ceramic composition. In contrast, when the mean particle diameter of the powdered ceramic in the insulating thick film composition is larger than that mentioned above, a layer formed of the insulating thick film composition may be insufficiently sintered in some cases when the conditions for baking the green ceramic composition. In addition, it is more preferable that the mean particle diameter of the powdered ceramic in the insulating thick film composition be smaller by about 30% or more than that of the powdered ceramic contained in the green ceramic body.

In the present invention, it is preferable that the mean particle diameter of the powdered ceramic contained in the green ceramic body be in the range of about 0.5 to 10 $\mu$m, and the mean particle diameter of the powdered ceramic in the insulating thick film composition be in the range of about 0.45 to 9 $\mu$m. In addition, it is more preferable that the mean particle diameter of the powdered ceramic contained in the green ceramic body be in the range of about 1 to 5 $\mu$m, and the mean particle diameter of the powdered ceramic in the insulating thick film composition be in the range of about 0.7 to 3 $\mu$m. When the mean particle diameters of the individual powdered ceramics are in the ranges mentioned above, the green ceramic body and the insulating thick film composition can be sufficiently sintered even at a relatively low temperature, and since the maximum particle size of the powdered ceramic in the insulating thick film composition can be controlled to be approximately 10 $\mu$m, the insulating thick film composition is clearly printed by using a screen printing method or the like, whereby an insulating thick film composition can be obtained which can form a superior pattern having clear shapes.

In the present invention, it is preferable that the insulating thick film composition contains substantially no glass component. In the case in which a glass component is not substantially present, no glass component can diffuse in the green ceramic body when the composition is baked together with the green ceramic body, and hence, the sintering characteristics thereof are not adversely influenced. As a result, a sintered ceramic body can be obtained in which the warping and distortion of the sintered body are suppressed and thereby providing superior electrical characteristics. In addition, since no glass component is localized at the surface of the conductive pattern, superior soldering characteristics and plating characteristics to the conductive pattern can be better ensured.

In order to discriminate the color of the insulating thick film composition from that of the green ceramic body (or, in order to discriminate the color of the sintered insulating thick film composition from that of the sintered ceramic body), the insulating thick film composition preferably contains an organic or an inorganic pigment. That is, when these two colors can be discriminated, the sensing and the inspection can be easily performed when printing the insulating thick film composition or mounting various mount components.

In order to discriminate the colors, for example, about 0.1 to 1.5 wt % of an organic pigment (such as copper phthalocyanine, an azo-based pigment or a quinacridone-based pigment) may be added to the powdered ceramic in the insulating thick film composition as an organic coloring agent. Alternatively, as an inorganic coloring agent, about 3 wt % or less of a powdered oxide composed of at least one metal selected from the group consisting of chromium, cobalt, copper, nickel, iron, and titanium may be used.

In addition, the insulating thick film composition preferably contains about 30 wt % or less of an inorganic filler with respect to the powdered ceramic in the insulating thick film composition. As the inorganic filler, a material having a relatively high melting point, which is difficult to sinter, may be preferably used. For example, there may be mentioned a powdered oxide ceramic, such as alumina, zirconia, magnesia or titanium oxide; and a powdered non-oxide ceramic, such as a nitride or a carbide. By adding the inorganic filler described above to the insulating thick film composition, variation in baking profile and variation in baking behavior due to a broad distribution of the particle diameters of the powdered ceramic are reduced, and a sintered body can be produced having stable qualities. In addition, the film strength and printing characteristics of the insulating thick film composition can be improved, and furthermore, the strength of the sintered body can also be improved. When the baking profile and the mean particle diameter of the powdered ceramic can be strictly controlled, the inorganic filler need not be used.

The green ceramic body is preferably a green ceramic laminate composed of green ceramic sheets, and an insulating layer composed of the insulating thick film composition may be formed on or inside the ceramic laminate. Even when the green ceramic sheet and the insulating thick film composition have the exactly same composition, the dispersibility of the powdered ceramic in the insulating thick film composition may be inferior to that of the ceramic powder in the green ceramic sheet in many cases. Accordingly, when the mean particle diameters of the individual powdered ceramics are controlled as described above, the variation in characteristics of the ceramic laminate and the deformation thereof can be sufficiently suppressed, whereby a highly reliable sintered ceramic body (in particular, a multilayer ceramic substrate) can be obtained having superior electrical characteristics and dimensional stability.

In the present invention, the powdered ceramic contained in the green ceramic body is preferably a powdered oxide ceramic primarily composed of barium oxide, silicon oxide, aluminum oxide and boron oxide, and the powdered ceramic in the insulating thick film composition preferably contains at least one powdered oxide ceramic selected from the group consisting of barium oxide, silicon oxide, aluminum oxide and boron oxide. The powdered ceramics having the composition systems described above can be baked even in a reducing atmosphere and can also be baked together with a low melting point metal which is inexpensive and has low resistivity, such as copper. However, the green ceramic body of the present invention is not limited to a green ceramic body composed of the powdered ceramic described above, and various powdered ceramics may be used, for example, $Al_2O_3$ or the like having a glass component mixed therewith, and a material which precipitates cordierite, anorthite, or the like. In addition, the conductive pattern that the green ceramic body has is not limited to a conductive pattern composed of copper, and various powdered metal, such as Ag, Au, Ni, Ag/Pt and Ag/Pd, may be used as a conductive component.

In the case in which the powdered ceramic contained in the green ceramic body has a composition in accordance with the composition system described above, the powdered ceramic in the insulating thick film composition preferably contains about 20 to 50 wt % of barium oxide as BaO, about 40 to 70 wt % of silicon oxide as $SiO_2$, about 2 to 10 wt % of aluminum oxide as $Al_2O_3$ and about 1 to 3 wt % of boron oxide as $B_2O_3$. An insulating thick film composition containing powdered ceramics having such a composition can be baked at about 1,000° C. or less in a reducing atmosphere and can produce a crystallized material such as celsian, whereby a pattern can be formed having a low $\in$, high Q value, superior high frequency characteristics, small stray capacitance, small baking deformation and high film strength.

When the content of the barium oxide in the powdered ceramic in the insulating thick film composition is less than about 20 wt % as BaO, the baking temperature tends to be higher than that mentioned above, and on the other hand, when the content is more than about 50 wt %, the reliability of moisture resistance or the like may be degraded in some cases. When the content of the silicon oxide is less than about 40 wt % as $SiO_2$, the $\in$ is increased, and the electrical characteristics may be adversely influenced in some cases, and on the other hand, when the content is more than about 70 wt %, the baking temperature may be higher than that mentioned above in some cases. When the content of the aluminum oxide is less than about 2 wt % as $Al_2O_3$, the flexural strength may be decreased in some cases, and on the other hand, when the content is more than about 10 wt %, the baking temperature tends to be higher than that mentioned above. In addition, when the content of the boron oxide is less than about 1 wt % as $B_2O_3$, the sintering temperature also tends to be higher than that mentioned above, and on the other hand, when the content is more than about 3 wt %, the reliability of moisture resistance or the like may be degraded in some cases.

Furthermore, the insulating thick film composition preferably contains about 3 wt % or less of an alkaline earth metal oxide, such as CaO, SrO or MgO, with respect to the powdered ceramic in the insulating thick film composition. Those alkaline earth metal oxides serve to improve the reliability of moisture resistance or the like by replacing Ba of the barium oxide described above. However, when the amount added of the alkaline earth oxide exceeds 3 wt %, the baking temperature may be increased or the electrical characteristics, such as $\in$ and Q, may be degraded in some cases.

Next, referring to FIG. 1, a ceramic electronic device of the present invention will be described with reference to an embodiment.

The ceramic electronic device shown in FIG. 1 is a multilayer ceramic module 1 composed of a multilayer ceramic substrate 2 as a body, and a semiconductor device 9 mounted on one of the major surfaces of the multilayer ceramic substrate 2 with solder 10 provided therebetween.

Internal conductive patterns 3 which form a capacitor and internal wiring are provided inside the multilayer ceramic substrate 2, and on one of the major surfaces of the substrate 2, surface conductive patterns 5 are provided each having an end to be used as a solder land. In addition, on the other major surface of the multilayer ceramic substrate 2, external terminals 6 are formed so as to cover parts of the side surfaces of the substrate 2, and the multilayer ceramic module 1 is connected to a mother board or the like, which is not shown, via the external terminals 6. Furthermore, a via hole 4 is formed in the multilayer ceramic substrate 2, and by the via hole 4, the internal conductive patterns 3 are connected to each other, and the internal conductive patterns 3 are connected to the surface conductive patterns 5 and to the external terminals 6.

Inside the multilayer ceramic substrate 2, an internal insulating layer 7 formed of the insulating thick film composition of the present invention is provided, and the internal insulating layer 7 serves as a material for reinforcing a strength of the multilayer ceramic substrate 2, a material for adjusting density so as to adjust distortion caused by the shrinkage generated in baking or a material for reducing irregularity so as to suppress the irregularity generated when the internal conductive patterns 3 or the surface conductive patterns 5 are formed by compressing.

In addition, on one of the major surfaces of the multilayer ceramic substrate 2, surface insulating layers 8 composed of the insulating thick film composition of the present invention are provided so that parts thereof cover the surface conductive patterns 5. The surface insulating layers 8 have low wettability to the solder 10, and hence, the surface insulating layers 8 serve as solder resist layers for preventing wet spreading of the solder 10. The surface insulating layers 8 also serve to improve adhesive strengths of the surface conductive patterns 5.

The multilayer ceramic module 1 can be manufactured by, for example, the process described below.

As a material for forming the multilayer ceramic substrate 2, an appropriate amount of an organic vehicle or a water-based vehicle is mixed with a low temperature sinterable powdered ceramic having a mean particle diameter of about 0.5 to 10 $\mu$m so as to prepare a slurry for forming green ceramic sheets. The slurry for forming green ceramic sheets is coated on a carrier film by the doctor blade method or the like so as to form sheets, and the sheets thus formed are dried, thereby forming the green ceramic sheets.

The low temperature sinterable powdered ceramic is a powdered ceramic which can be baked at a melting point or less (in particular, about 1,000° C. or less) of a powdered metal, such as Ag, Cu, Au, Ni, Ag/Pd and Ag/Pt, and as an example, there may be mentioned, as described above, a powdered non-glass ceramic composed of barium oxide, silicon oxide, aluminum oxide, calcium oxide, boron oxide and the like; a powdered glass composite ceramic composed of a powdered ceramic, such as $Al_2O_3$, containing a glass component as an auxiliary agent for sintering; or a powdered crystallized glass-based ceramic.

The organic vehicle is composed of a binder, such as polyvinyl alcohol, ethyl cellulose, an acrylic resin, polybutyl butyral or a methacrylic resin; and a solvent, such as toluene, terpineol, butyl carbitol acetate or an alcohol; and when necessary, various dispersing agents, plasticizers, activators and the like may be added (vehicles used for the conductive paste and the insulating thick film composition described below are substantially equivalent to those described above).

Next, after openings used for via holes are formed in the green ceramic sheets by punching or the like when necessary, the conductive paste, composed of a powdered metal, such as Ag, Cu, Au, Ni, Ag/Pd or Ag/Pt, mixed with the organic vehicle, is filled in the openings used for via holes. In addition, a conductive paste similar to that described above is screen-printed on predetermined green ceramic sheets, thereby forming conductive patterns used as the internal conductive patterns 3 and surface conductive patterns 5.

Subsequently, an insulating thick film conductive composition is prepared for forming the internal insulating layer 7 and the surface insulating layers 8. This insulating thick film composition is composed of a powdered ceramic having the same composition system as that of the low temperature sinterable powdered ceramic and an appropriate amount of an organic vehicle or a water-based vehicle, wherein the powdered ceramic has a mean particle diameter smaller than that of the low temperature sinterable powdered ceramic by about 10% or more.

In particular, this insulating thick film composition is primarily composed of a powdered ceramic having a mean particle diameter of about 0.45 to 9 $\mu$m, contains no glass component as an auxiliary agent for sintering, and contains an organic or an inorganic coloring agent in a predetermined ratio. In more particular, the insulating thick film composition is composed of a powdered ceramic containing about 20 to 50 wt % of barium oxide as BaO, about 40 to 70 wt % of silicon oxide as $SiO_2$, about 2 to 10 wt % of aluminum oxide as $Al_2O_3$ and about 1 to 3 wt % of boron oxide as $B_2O_3$; and about 30 wt % or less of an inorganic filler and about 3 wt % or less of an alkaline earth metal oxide with respect to the powdered ceramic. In consideration of the printing characteristics, the viscosity of the insulating thick film composition is preferably 50 to 300 Pa·s.

Next, in order to form the internal insulating layer 7 and the surface insulating layers 8 on the green ceramic sheets formed beforehand, the insulating thick film composition is coated on predetermined locations by screen printing so as to form coating layers. Subsequently, the green ceramic sheets thus formed are laminated with each other and are then compressed together, thereby yielding a green ceramic laminate.

The green ceramic laminate is then baked at about 1,000° C. or less in, for example, the air or a reducing atmosphere, thereby forming a sintered ceramic body (in this case, the multilayer ceramic substrate 2).

When the multilayer ceramic body is formed in a manner described above, since the condition for baking the multilayer ceramic substrate should be a number one priority to be determined, the insulating thick film composition may be held at a temperature higher than the sintering temperature therefor in some cases. Accordingly, at the interface of the insulating layer composed of the insulating thick film composition and the multilayer ceramic substrate or at the interface of the insulating layer and the conductive pattern, mutual reaction (in particular, reaction driven by diffusion) occurs briskly so as to decrease the difference in concentration between the individual materials, and as a result, various characteristics are adversely influenced. Hence, the insulating thick film composition must be formed so as to have a small difference in concentration from those of the materials in contact therewith and must also be formed so as to have stable sintering characteristics in a temperature range of baking the multilayer ceramic substrate.

In addition, even though the same material composition is used, the sintering characteristics (sintering behavior) may differ between the insulating thick film composition (which, in general, is difficult to sinter) and the green ceramic sheet in many cases since the amount of vehicle and the type thereof may differ from each other, and in addition, the dispersibility and filling density of the powdered ceramic may differ from each other. Accordingly, a glass component or the like is conventionally added to the insulating thick film composition which is formed into an insulating layer, so as to improve the sintering characteristics thereof; however, as described above, various adverse influences caused by the diffusion of the glass component may be observed in some cases.

According to this embodiment, the insulating thick film composition is primarily composed of a powdered ceramic having the same composition system as that of the green ceramic sheet, and in addition, the mean particle diameter of the powdered ceramic is smaller than that of the powdered ceramic contained in the green ceramic sheet; hence, the sintering characteristics of the insulating thick film composition can be sufficiently improved, and as a result, it is not necessary to add a glass component or the like as an auxiliary agent for sintering.

In addition, since a composition containing no glass component which degrades the electrical characteristics and the mechanical strength of the multilayer ceramic substrate is applied to the multilayer ceramic substrate, a highly reliable insulating layer can be formed having a very high degree of crystallization, equivalent to the multilayer ceramic substrate, and in addition, the printing characteristics and the sensing characteristics can also be improved.

Since the insulating thick film composition of the present invention contains substantially no glass component as an auxiliary agent for sintering, a sintering defect is unlikely to occur in baking by the mutual reaction between the insulating thick film composition and the green ceramic body, and warping, degradation in electrical properties, and the like are also unlikely to occur. In addition, since the insulating thick film composition of the present invention is baked together with the multilayer ceramic substrate and the conductive pattern, a high degree of positional accuracy can be obtained, and hence, the reliability of the multilayer ceramic substrate can be improved. When the insulating thick film composition is used for a surface insulating layer, this insulating layer can be effectively used as a solder resist layer used for a multilayer ceramic substrate having multiterminals with narrower pitches, and when the insulating thick film composition is used for an internal layer, this internal layer can be effectively used as a material for adjusting density in the substrate, a material for reducing irregularity, and the like.

Heretofore, the ceramic electronic device of the present invention is described by using the multilayer ceramic module 1; however, the ceramic electronic device of the present invention is not limited to modules composed of passive devices, such as chip capacitors, and active devices, such as semiconductor devices, mounted on multilayer ceramic substrates. For example, the ceramic electronic device of the present invention can be applied to a multilayer ceramic substrate, such as a substrate for a multichip module, and a substrate for packaging; and chip devices, such as a chip capacitor, a chip coil and a chip antenna. In addition, the ceramic electronic device of the present invention may be composed of a single ceramic substrate or a multilayer ceramic substrate, and in particular, when the ceramic electronic device is composed of a multilayer ceramic substrate, a cavity may be formed, and a material having a high ∈ may be embedded in the substrate. In the claims which follow, such active and passive are collectively referred to as an "electrical functional device".

In addition, the electronic apparatus of the present invention may be an electronic apparatus, such as a mobile communication apparatus or a computer, which is provided with the aforementioned multilayer ceramic substrate, the multilayer ceramic module, the chip device, and the like. For example, a ceramic electronic device, such as the multilayer ceramic module 1, may be used in an input-output processing portion of a mobile communication apparatus and the like.

In the embodiments described above, the insulating thick film composition is coated so as to form the surface insulating layer before the individual green ceramic sheets are compressed together; however, the composition may be coated after the individual green ceramic sheets are compressed together. In the case described above, since the multilayer ceramic substrate after compression has a superior surface flatness, printing of the insulating thick film composition can be satisfactory performed, but irregularity may be formed by the insulating thick film composition in some cases. When the irregularity thus formed is a disadvantage in mounting components or forming bumps, the step of compressing is preferably performed again after the insulating thick film composition is printed.

In addition, when the insulating thick film composition of the present invention is formed on one of the major surfaces of the green ceramic body, the composition may also be used as the aforementioned material for reinforcing strength, the material for adjusting density and the material for reducing irregularity.

EXAMPLES

Hereinafter, the present invention will be described with reference to the particular examples.

A $BaO$—$SiO_2$—$Al_2O_3$—$B_2O_3$-based powdered ceramic (the mean particle diameter was 2.5 μm) was first prepared, and appropriate amounts of an organic binder composed of polybutyl butyral, a plasticizer composed of di-n-butyl phthalate, and an organic solvent composed of toluene and isopropyl alcohol were mixed with the powdered ceramic, thereby preparing a slurry for forming green ceramic sheets. The composition of the powdered ceramic was 33 wt % of $BaO$, 60 wt % of $SiO_2$, 5 wt % of $Al_2O_3$ and 2 wt % of $B_2O_3$.

Next, the slurry thus formed was coated on a carrier film by the doctor blade method so as to form sheets and was dried, whereby green ceramic sheets 100 μm thick were formed.

In addition, to $BaO$—$SiO_2$—$Al_2O_3$—$B_2O_3$-based powdered ceramics having the compositions shown in Table 1 below, inorganic fillers and alkaline earth metal oxides were added as shown in Table 1. Appropriate amounts of an organic binder and an organic solvent were then added to the individual compositions thus formed, and the mixtures were stirred and kneaded by a shaking mill and a three-roll mill, thereby preparing insulating thick film compositions of the sample Nos. 1 to 14 shown in Table 1 below.

TABLE 1

| No. | MAIN COMPONENT (POWDERED CERAMIC) | | | | | INORGANIC FILLER ADDITION | | ALKALINE EARTH METAL OXIDE | | |
|---|---|---|---|---|---|---|---|---|---|---|
| | BaO (wt %) | SiO$_2$ (wt %) | Al$_2$O$_3$ (wt %) | B$_2$O$_3$ (wt %) | MEAN PARTICLE DIAMETER (μm) | TYPE | AMOUNT (wt %) | CaO (wt %) | SrO (wt %) | MgO (wt %) |
| 1 | 33 | 60 | 5 | 2 | 2.3 | — | — | — | — | — |
| 2 | 33 | 60 | 5 | 2 | 1.8 | — | — | — | — | — |
| 3 | 35 | 60 | 0 | 5 | 2.1 | — | — | — | — | — |
| 4 | 35 | 60 | 5 | 2 | 1.2 | — | — | — | — | — |
| 5 | 33 | 60 | 5 | 2 | 1.2 | ALUMINA | 10 | — | — | — |
| 6 | 33 | 60 | 5 | 2 | 1.2 | ALUMINA | 20 | — | — | — |
| 7 | 33 | 60 | 5 | 2 | 0.9 | ALUMINA | 30 | — | — | — |
| 8 | 33 | 60 | 5 | 2 | 1.2 | ALUMINA | 40 | — | — | — |
| 9 | 33 | 60 | 5 | 2 | 1.1 | ALUMINA | 10 | 1 | 2 | 0.5 |
| 10 | 33 | 60 | 5 | 2 | 1.0 | ALUMINA | 10 | 4 | — | — |
| 11 | 37 | 50 | 10 | 3 | 1.5 | ZIRCONIA | 5 | — | 2 | — |
| 12 | 15 | 80 | 10 | 5 | 1.1 | — | — | — | — | — |
| 13 | 33 | 60 | 5 | 2 | 2.5 | — | — | — | — | — |
| 14 | 33 | 60 | 5 | 2 | 2.8 | — | — | — | — | — |

Next, after the insulating thick film composition was printed on the entire surface of a ceramic laminate (0.8 mm thick) composed of ten green ceramic sheets described above, the laminate was then cut into 2 inch by 2 inch portions, and the cut laminate thus formed was thermally compressed at 80° C. and at 200 kg/cm$^2$. Subsequently, the ceramic laminate was baked at 1,000° C. or less in a reducing atmosphere.

The sintering characteristics and the warpage of each multilayer ceramic substrate thus obtained were evaluated. In order to evaluate sintering characteristics, each multilayer ceramic substrate was immersed in a penetrant (red ink), and the degree of remaining penetrant in the multilayer ceramic substrate was observed after washing was performed using flowing purified water. The sintering characteristics were classified into three grades, i.e., superior sintering characteristics (⊚), good sintering characteristics (○), and inferior sintering characteristics (×), in accordance with the degree of remaining penetrant. In this evaluation, "superior sintering characteristics" means that a penetrant is not observed in the multilayer ceramic substrate and a dense sintered body is formed; "good sintering characteristics" means that a small number of pore is observed but a dense sintered body is formed; and "inferior sintering characteristics" means that penetration of the penetrant is observed in the multilayer ceramic substrate and a dense sintered body is not obtained. The results are shown in Table 2 below.

TABLE 2

| No. | SINTERING CHARACTERISTICS | WARPAGE (μm) |
|---|---|---|
| 1 | o | +80 |
| 2 | ⊚ | −30 |
| 3 | ⊚ | −50 |
| 4 | o | −80 |
| 5 | ⊚ | ±20 |
| 6 | ⊚ | +30 |
| 7 | ⊚ | +30 |
| 8 | o | +100 |
| 9 | ⊚ | ±20 |
| 10 | o | +70 |
| 11 | ⊚ | +30 |
| 12 | o | +140 |
| 13 | x | +200 |
| 14 | x | +250 |

As can be seen in Table 2, by using the insulating thick film compositions (the sample Nos. 1 to 12) of this example, multilayer ceramic substrates having superior sintering characteristics were obtained without a substantial increase in warpage. In addition, event though not shown in the table, the insulating thick film substrates of the examples had superior printing characteristics allowing a high degree of accuracy, whereby fine patterns could be formed.

In Table 3 below, the electrical characteristics of a multilayer ceramic substrate formed by using the insulating thick film composition of the sample No. 5 are shown together with those of a multilayer ceramic substrate formed by using an insulating thick film composition (No. 15) composed of a BaO(30 wt %)—SiO$_2$(60 wt %)—Al$_2$O$_3$(5 wt %)—B$_2$O$_3$(2 wt %)-based powdered ceramic having a mean particle diameter of 2.5 mm, 5 wt % of borosilicate glass having a softening temperature of 600° C. with respect to the powdered ceramic described above, and an organic vehicle equivalent to that described above.

TABLE 3

| No. | SINTERING CHARACTERISTICS | ε | Q | Tcc (ppm/° C.) | IR (Ω) |
|---|---|---|---|---|---|
| 5 | ⊚ | 6 | 1,800 | 0 ± 30 | $10^{12}$ or more |
| 15 | ⊚ | 7 | 1,300 | 80 ± 20 | $10^7$ |

As shown in Table 3, since the multilayer ceramic substrate formed by using the insulating thick film composition of No. 15 contained a glass component, the dielectric constant ∈ was slightly degraded and the temperature coefficient of capacitance Tcc was also slightly degraded, compared to those of the multilayer ceramic substrate formed by using the insulating thick film composition of No. 5. In addition, since the grain boundaries of the multilayer ceramic substrate are disordered due to the presence of the glass component, the Q was slightly decreased. Furthermore, pores were produced in the vicinity of the interface of the insulating thick film composition and the multilayer ceramic substrate, and thereby the insulation reliability (IR) also tended to degrade.

When 0.5 wt % of copper phthalocyanine was added as a coloring agent, in contrast with the white multilayer ceramic substrate, the insulating layer formed of the insulating thick film composition was blue, and hence, the individual layers were easily discriminated.

Since the insulating thick film composition of the present invention is primarily composed of a powdered ceramic having the same composition system as that of the powdered ceramic contained in the green ceramic body, and since the mean particle diameter of the powdered ceramic is smaller than that of the powdered ceramic contained in the green ceramic body, a reaction between the green ceramic body and the insulating thick film substrate is suppressed, and hence, the electrical characteristics and the dimensional stability of the green ceramic body can be improved.

In addition, since the ceramic electronic device of the present invention can be obtained by a step of coating the insulating thick film composition of the present invention as a solder resist, a material for reinforcing strength, a material for adjusting density or a material for reducing irregularity on and/or in the green ceramic body having a predetermined conductive pattern, and a step of baking the composition together with the green ceramic body, the ceramic electronic device has superior electrical characteristics and stable shape having a small warpage and distortion. That is, a compact and highly reliable electronic apparatus can be produced having higher performance by using the electronic devices of the present invention.

What is claimed is:

1. A combination of an insulating thick film composition comprising a first powdered ceramic disposed on or in a green ceramic body comprising a second powdered ceramic, wherein the first and second powdered ceramics each comprise a plurality of particles having a particle diameter and contain at least one inorganic component in common and wherein the diameter of the first powdered ceramic have a mean which is smaller than that of the second powdered ceramic.

2. The insulating thick film composition according to claim 1, wherein the mean particle diameter of the first powdered ceramic is smaller than that of the second powdered ceramic by at least about 10%.

3. The insulating thick film composition according to claim 2, wherein the mean particle diameter of the second powdered ceramic is about 0.5 to 10 μm, and the mean particle diameter of the first powdered ceramic is about 0.45 to 9 μm.

4. The insulating thick film composition according to claim 3, wherein the mean particle diameter of the second powdered ceramic is about 1 to 5 μm, and the mean particle diameter of the first powdered ceramic is about 0.7 to 3 μm.

5. The insulating thick film composition according to claim 4, wherein the insulating thick film composition contains about 3 wt % or less of an alkaline earth metal oxide with respect to the first powdered ceramic, a pigment and is substantially glass-free, and wherein the first powdered ceramic contains about 20 to 50 wt % of barium oxide as BaO, about 40 to 70 wt % of silicon oxide as SiO$_2$, about 2 to 10 wt % of aluminum oxide as Al$_2$O$_3$ and about 1 to 3 wt % of boron oxide as B$_2$O$_3$, and the second powdered ceramic comprises a powdered oxide ceramic comprising barium oxide, silicon oxide, aluminum oxide or boron oxide.

6. The insulating thick film composition according to claim 1, wherein the insulating thick film composition substantially glass-free.

7. The insulating thick film composition according to claim 1, wherein the insulating thick film composition contains about 0.1 to 1.5 wt % of an organic pigment with respect to the first powdered ceramic.

8. The insulating thick film composition according to claim 1, wherein the insulating thick film composition contains about 3 wt % or less of a powdered oxide composed of at least one metal selected from the group consisting of chromium, cobalt, copper, nickel, iron and titanium with respect to the first powdered ceramic.

9. The insulating thick film composition according to claim 1, wherein the insulating thick film composition contains about 30 wt % or less of an inorganic filler with respect to the first powdered ceramic.

10. The ceramic electronic device comprising a baked combination of claim 5, and wherein the green ceramic body includes at least one conductive pattern associated therewith.

11. The ceramic electronic device comprising a baked combination of claim 1, and wherein the green ceramic body includes at least one conductive pattern associated therewith.

12. The ceramic electronic device according to claim 11, wherein the green ceramic body is a green ceramic laminate having a layer of the insulating thick film composition on at least one of an external surface and on an internal surface of the green ceramic laminate.

13. The ceramic electronic device according to claim 12, wherein the second powdered ceramic comprises a powdered oxide ceramic comprising barium oxide, silicon oxide, aluminum oxide or boron oxide, and the first powdered ceramic comprises at least one powdered oxide ceramic selected from the group consisting of barium oxide, silicon oxide, aluminum oxide and boron oxide.

14. The ceramic electronic device according to claim 13, wherein the first powdered ceramic contains about 20 to 50 wt % of barium oxide as BaO, about 40 to 70 wt % of silicon oxide as $SiO_2$, about 2 to 10 wt % of aluminum oxide as $Al_2O_3$ and about 1 to 3 wt % of boron oxide as $B_2O_3$.

15. The ceramic electronic device according to claim 14, wherein the insulating thick film composition contains about 3 wt % or less of an alkaline earth metal oxide with respect to the first powdered ceramic.

16. The ceramic electronic device according to claim 11, wherein the insulating thick film composition is disposed on the surface of the green ceramic body so as to constitute a solder resist layer.

17. The ceramic electronic device according to claim 11, wherein the insulating thick film composition is disposed inside the green ceramic body as a material for reinforcing strength, a material for adjusting density, a material for reducing irregularity or a combination thereof.

18. The ceramic electronic device according to claim 11, wherein said device has at least one major surface and wherein an electrical functional device is mounted on said at least one of the major surface.

19. An electronic apparatus comprising a ceramic electronic device in which said device is a ceramic electronic device according to claim 18.

20. An electronic apparatus comprising a ceramic electronic device in which said device is a ceramic electronic device according to claim 11.

21. A combination of an insulating thick film composition comprising a first powdered ceramic disposed on or in a green ceramic body comprising a second powdered ceramic and a conductive pattern comprising a powdered metal, wherein the first and second powdered ceramics contain at least one inorganic component in common and wherein the mean particle diameter of the first powdered ceramic is smaller than that of the second powdered ceramic.

22. The insulating thick film composition according to claim 21, wherein the mean particle diameter of the first powdered ceramic is smaller than that of the second powdered ceramic by at least about 10%.

23. The insulating thick film composition according to claim 22, wherein the mean particle diameter of the second powdered ceramic is about 0.5 to 10 μm, and the mean particle diameter of the first powdered ceramic is about 0.45 to 9 μm.

24. The insulating thick film composition according to claim 23, wherein the mean particle diameter of the second powdered ceramic is about 1 to 5 μm, and the mean particle diameter of the first powdered ceramic is about 0.7 to 3 μm.

25. The insulating thick film composition according to claim 24, wherein the insulating thick film composition contains about 3 wt % or less of an alkaline earth metal oxide with respect to the first powdered ceramic, a pigment and is substantially glass-free, and wherein the first powdered ceramic contains about 20 to 50 wt % of barium oxide as BaO, about 40 to 70 wt % of silicon oxide as $SiO_2$, about 2 to 10 wt % of aluminum oxide as $Al_2O_3$ and about 1 to 3 wt % of boron oxide as $B_2O_3$, and the second powdered ceramic comprises a powdered oxide ceramic comprising barium oxide, silicon oxide, aluminum oxide or boron oxide.

26. The insulating thick film composition according to claim 21, wherein the green ceramic body comprises a green laminate comprising a the conductive pattern and a plurality of said green sheets.

27. A ceramic electronic device comprising a baked combination of claim 21, wherein the green ceramic body was a green ceramic laminate having a layer of the insulating thick film composition on at least one of an external surface and on an internal surface of the green ceramic laminate, the second powdered ceramic comprises a powdered oxide ceramic comprising barium oxide, silicon oxide, aluminum oxide or boron oxide, and the first powdered ceramic comprises at least one powdered oxide ceramic selected from the group consisting of barium oxide, silicon oxide, aluminum oxide and boron oxide.

28. The ceramic electronic device according to claim 27, wherein the first powdered ceramic contains about 20 to 50 wt % of barium oxide as BaO, about 40 to 70 wt % of silicon as $SiO_2$, about 2 to 10 wt % of aluminum oxide as $Al_2O_3$ and about 1 to 3 wt % of boron oxide as $B_2O_3$, and wherein the insulating thick film composition contains about 3 wt % or less of an alkaline earth metal oxide with respect to the first powdered ceramic.

* * * * *